(12) United States Patent
Forbes

(10) Patent No.: US 6,512,400 B1
(45) Date of Patent: Jan. 28, 2003

(54) INTEGRATED CIRCUIT COMPARATOR OR AMPLIFIER

(75) Inventor: Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 89 days.

(21) Appl. No.: 09/651,631

(22) Filed: Aug. 30, 2000

(51) Int. Cl.⁷ ................................................. H03K 5/22
(52) U.S. Cl. .......................... 327/66; 327/563; 330/253
(58) Field of Search ............................. 327/63, 65, 67, 327/563, 112; 330/252, 253

(56) References Cited

U.S. PATENT DOCUMENTS

| | | | |
|---|---|---|---|
| 4,461,964 A | | 7/1984 | Shiotari ........................ 307/362 |
| 5,241,502 A | * | 8/1993 | Lee et al. ..................... 327/112 |
| 5,600,275 A | | 2/1997 | Garavan ....................... 327/307 |
| 5,646,571 A | * | 7/1997 | Ohashi ......................... 327/112 |
| 5,831,458 A | * | 11/1998 | Nakagawa .................... 327/112 |
| 5,909,127 A | * | 6/1999 | Pearson et al. ................ 327/65 |
| 5,939,926 A | * | 8/1999 | Uber ............................ 327/112 |

OTHER PUBLICATIONS

LMC7221—Tiny CMOS Comparator with Rail-to-Rail Input and Open Drain Output, Sep. 1998.

* cited by examiner

Primary Examiner—Kenneth B. Wells
(74) Attorney, Agent, or Firm—Williams, Morgan & Amerson

(57) ABSTRACT

An integrated circuit comparator includes a differential amplifier, a source follower circuit coupled to a gate terminal of a first transistor in the differential amplifier, and an output circuit. One or more source follower circuits may be utilized in connection with the differential amplifier, and one or more source follower circuits may be utilized in connection with the output circuit.

26 Claims, 3 Drawing Sheets

INTEGRATED CIRCUIT COMPARATOR OR AMPLIFIER

BACKGROUND OF THE INVENTION

1. Field of the Invention

The present invention relates generally to integrated circuit comparators, and, more particularly, to integrated circuit comparators for use in low voltage applications.

2. Description of the Related Art

A conventional CMOS voltage comparator 10 is illustrated in FIG. 1. The CMOS voltage comparator 10 includes a differential amplifier II and an inverter 12. A reference voltage VR is applied to one input of the differential amplifier 11, i.e., a gate terminal of a transistor 21, and an input voltage V1 to be compared to the reference voltage is applied to another input to the differential amplifier 11, i.e., a gate terminal of a transistor 22. In operation, when the input voltage V1 becomes higher than the reference voltage VR, an output signal on a line 25 switches from a low voltage, for example, a logic level "zero," to a high voltage, for example, a logic level "one." When the input voltage V1 becomes lower than the reference voltage VR, the transistor 22 turns off, the input signal to the inverter 12 becomes high, and the output signal VOUT changes from a high state to a low state. In this manner, the input voltage V1 is compared to the reference voltage VR. Ideally, the transition between logic levels at the output line 25 will occur when V1 is equal to VR, there being no offset voltage. Also ideally, the transition between logic levels will occur with no time delay, the speed of the comparator 10 being very fast. These ideals are rarely, if ever, attained.

Comparators are widely used in integrated circuits, for example, in analog-to-digital converters and as voltage signal receivers on interconnections and clock distribution lines. Two primary concerns in the application of comparators are the mismatch of transistor characteristics, resulting in voltage offsets, and the speed of operation, or time delay in operation. Because one of the basic components of a comparator is a differential amplifier, which typically involves three transistors coupled in series, operation of the comparator becomes slower and less reliable as power supply voltages are reduced. Lower power supply voltages result in lower magnitudes of the excess of gate voltage above the threshold voltage of the MOS transistors. The switching current, or saturation current, depends upon the square of this excess gate voltage:

$$Ids=(uCo)\ (W/L)\ (VGS-VT)^2/2$$

The time, t, required to discharge a capacitor with charge Q can be estimated as:

$$t=Q/Ids$$

If the excess of gate-to-source voltage above threshold (VGS-VT) is small, the delay time will be long, and the circuits will operate at low switching speeds.

The inverter 12 of FIG. 1 is a conventional single-ended input, single-ended output, CMOS amplifier. To illustrate the operation of the inverter amplifier 12, assume a power supply potential 26 is 1.6 volts, i,e., VDD equals 1.6 volts DC. Assume further that the quiescent input and output voltages are at VDD/2, or 0.8 volts DC. Both the PMOS transistor 28 and the NMOS transistor 30 are assumed, for purposes of illustration, to have matching characteristics and matching threshold voltages of 0.5 volts. That is, VTN equals 0.5 volts, and VTP equals –0.5 volts. In practice, different sizes or W/L ratios can be used to compensate for the fact that the transistors do not have matching characteristics. Assuming the stated values, the turn-on time for the inverter amplifier 12 is approximately three nanoseconds, whereas, the turn-off time for the inverter amplifier 12 is on the order of tens of nanoseconds.

Low switching speeds and circuit functional failure at low power supply voltages are even more acute in differential amplifiers that form part of a comparator circuit, such as the comparator circuit 10 of FIG. 1. In the differential amplifier 11 of the comparator circuit 10 of FIG. 1, three devices, transistors 21, 23, 24, are coupled in series between the power supply potential 26 and the power supply ground 29. Also, three other transistors 22, 24, 27 are coupled in series between the power supply potential 26 and the power supply ground 29. Each of the transistors 21, 22, 23, 24, 27 needs a reasonable magnitude of excess gate voltage above threshold to operate properly. With the power supply potential 26 equal to 1.5 volts DC, the turn-on time for the comparator 10 is just over one nanosecond, while the turn-off time is on the order of 3–4 nanoseconds. When the power supply potential 26 is dropped to 1.2 volts DC, the turn-on time lengthens to approximately 4 nanoseconds, while the turn-off time lengthens to approximately 6 nanoseconds. When the power supply potential 26 is dropped even further, to 0.9 volts DC, the turn-on time for the comparator 10 is again approximately 4 nanoseconds, but the turn-off time approaches 10 nanoseconds, becoming so long that the comparator 10 begins to function incorrectly.

The present invention is directed to eliminating, or at least reducing the effects of, some or all of the aforementioned problems.

SUMMARY OF THE INVENTION

In one aspect of the present invention, an integrated circuit comparator comprises a differential amplifier, a source follower circuit coupled to a gate terminal of a first transistor in the differential amplifier, and an output circuit. A single or multiple source follower circuits may be utilized as desired.

In another aspect of the present invention, an integrated circuit comparator comprises a differential amplifier, a first power supply line coupled to the differential amplifier, the first power supply line adapted to receive a positive power supply potential of approximately 0.9 volts, a source follower circuit coupled to a gate terminal of a first transistor in the differential amplifier, and an output circuit. A single or multiple source follower circuit may be utilized as desired.

In yet another aspect of the present invention, a differential amplifier comprises first and second transistors coupled in electrical series between a first node and a second node, third and fourth transistors coupled in electrical series between the first node and the second node, and a source follower circuit coupled to a gate terminal of the first transistor, the second transistor adapted to receive a first input signal, and the fourth transistor adapted to receive a second input signal.

In yet another aspect of the present invention, a low voltage amplifier comprises a first transistor and a second transistor coupled in electrical series between first and second power supply nodes, a source follower circuit coupled to a gate terminal of the first transistor, and an input line coupled to the source follower circuit and coupled to a gate terminal of the second transistor.

In another aspect of the present invention, a low voltage amplifier comprises first and second transistors coupled in electrical series between first and second power supply nodes, a third transistor coupled between the first power supply node and a gate terminal of the first transistor, a current source device coupled between the gate terminal of the first transistor and the second power supply node, and an input node coupled to a gate terminal of the third transistor and to a gate terminal of the second transistor.

BRIEF DESCRIPTION OF THE DRAWINGS

The invention may be understood by reference to the following description, taken in conjunction with the accompanying drawings, in which like reference numerals identify like elements, and in which.

Figure 1:
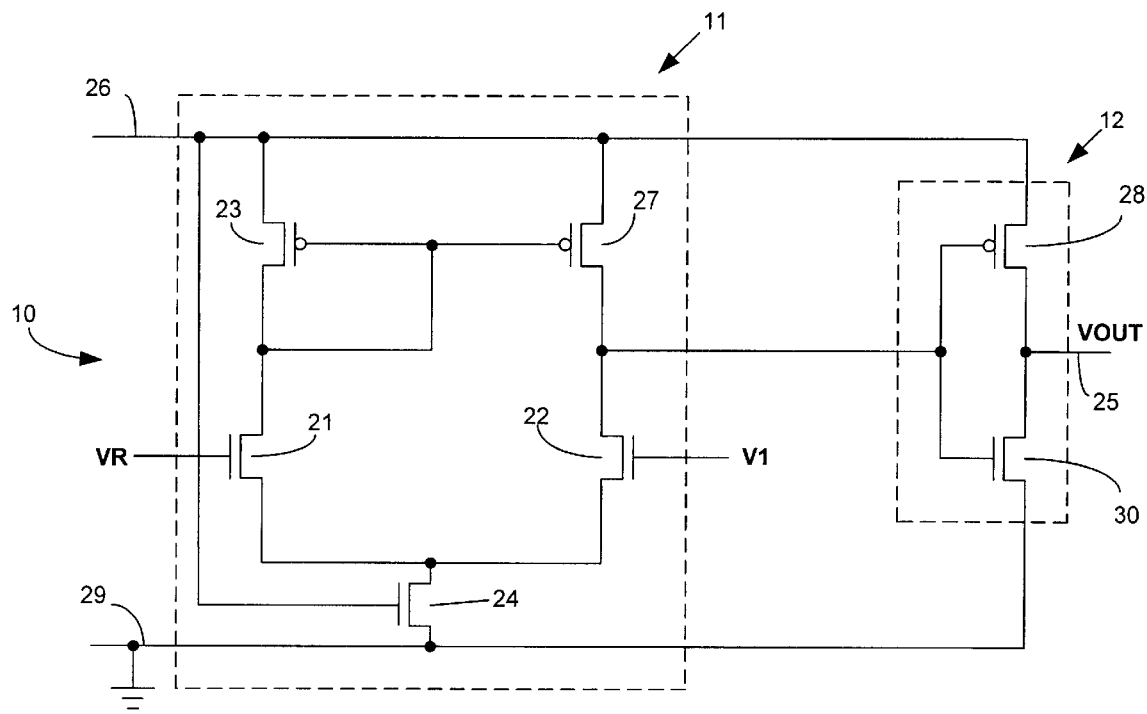
FIG. 1 is a schematic diagram illustrating a conventional CMOS voltage comparator.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–4. In general, the present invention is directed to a comparator circuit useful in low voltage applications. The illustrative embodiments shown in FIGS. 2–4 and described herein utilize n-channel and p-channel transistors in particular arrangements. However, as will be readily apparent to those skilled in the art upon a complete reading of the present application, the present invention is applicable to, and may be realized in, a variety of technologies, e.g., NMOS, PMOS, CMOS, SOI, etc. Moreover, the present invention may be realized using a variety of transistors and devices in other forms and/or arrangements. Further, the present invention will find application in a wide variety of integrated circuit devices, including, but not limited to, microprocessors, logic devices, memory devices, etc. Accordingly, the attached drawings and description herein are intended only to describe and explain illustrative examples of the present invention.

Figure 2:
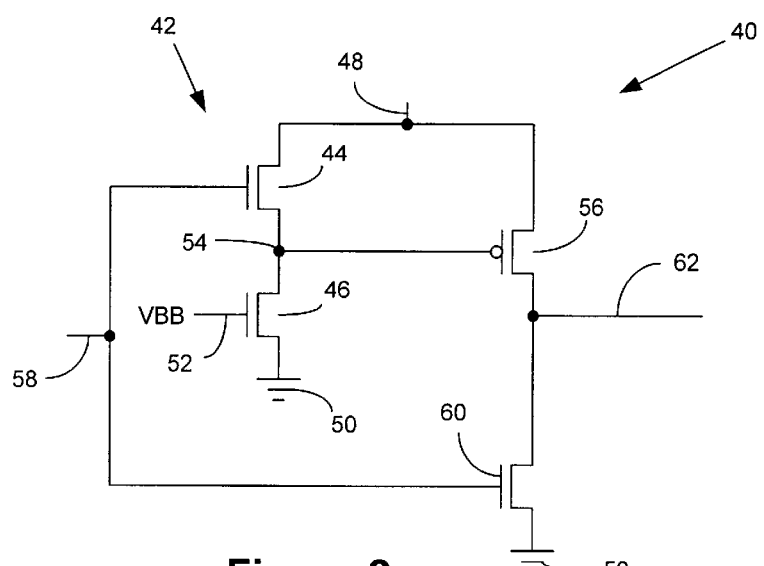
FIG. 2 is a schematic diagram of one illustrative low voltage single-ended input, single-ended output CMOS inverter amplifier utilizing aspects of the present invention.

FIG. 2 is a schematic diagram of one illustrative low voltage amplifier 40 utilizing aspects of the present invention. The amplifier 40 includes a source follower circuit 42 comprising two NMOS transistors 44, 46 coupled in series between a first power supply potential 48 and a second power supply potential 50. In the particular embodiment illustrated in FIG. 2, the first power supply potential 48 is a positive 0.9 volts DC, and the second power supply potential 50 is a power supply ground potential. A gate terminal 52 of the transistor 46 is coupled to a potential supply VBB, which is approximately 0.3 volts DC, and the transistor 46 functions as a current source.

A node 54 of the source follower circuit 42 is coupled to a gate terminal of a PMOS transistor 56. The PMOS transistor 56 is coupled in series with an NMOS transistor 60 between the first power supply potential 48 and the second power supply potential 50. An input voltage at line 58 is applied to a gate terminal of the transistor 44 and to a gate terminal of the transistor 60. An output signal of the low voltage amplifier 40 appears at the line 62. Because the output signal of the source follower circuit 42, rather than the input signal on the line 58, is used to drive the PMOS transistor 56, a voltage in excess of VDD/2 may be applied to the gate of the NMOS transistor 60. Because the source follower circuit 42 will shift the input voltage downward, a gate-to-source voltage of magnitude (VDD+VX)/2, that is, a voltage in excess of VDD/2, can also be applied to the gate of the PMOS transistor 56. The greater magnitudes of gate-to-source voltage on the NMOS transistor 60 and the PMOS transistor 56 result in better switching speeds for a given power supply voltage, or the same switching speeds as conventional amplifiers can be achieved despite a drop in the power supply voltage. For example, utilizing a power supply voltage, VDD=0.9 volts DC, and a much lower input voltage to drive the amplifier circuit 40, the turn on switching speed for the low voltage amplifier 40 of FIG. 2 is faster than the switching speed in the conventional CMOS inverter amplifier 12 of FIG. 1 with a higher supply voltage of VDD=1.6 volts DC and higher input voltage. In particular, the turn on switching time for the amplifier 40 of FIG. 2 is less than 2 nanoseconds. The turn off switching speed of the amplifier 40 is comparable to that of the conventional CMOS amplifier in spite of the much lower power supply voltage.

Figure 3:
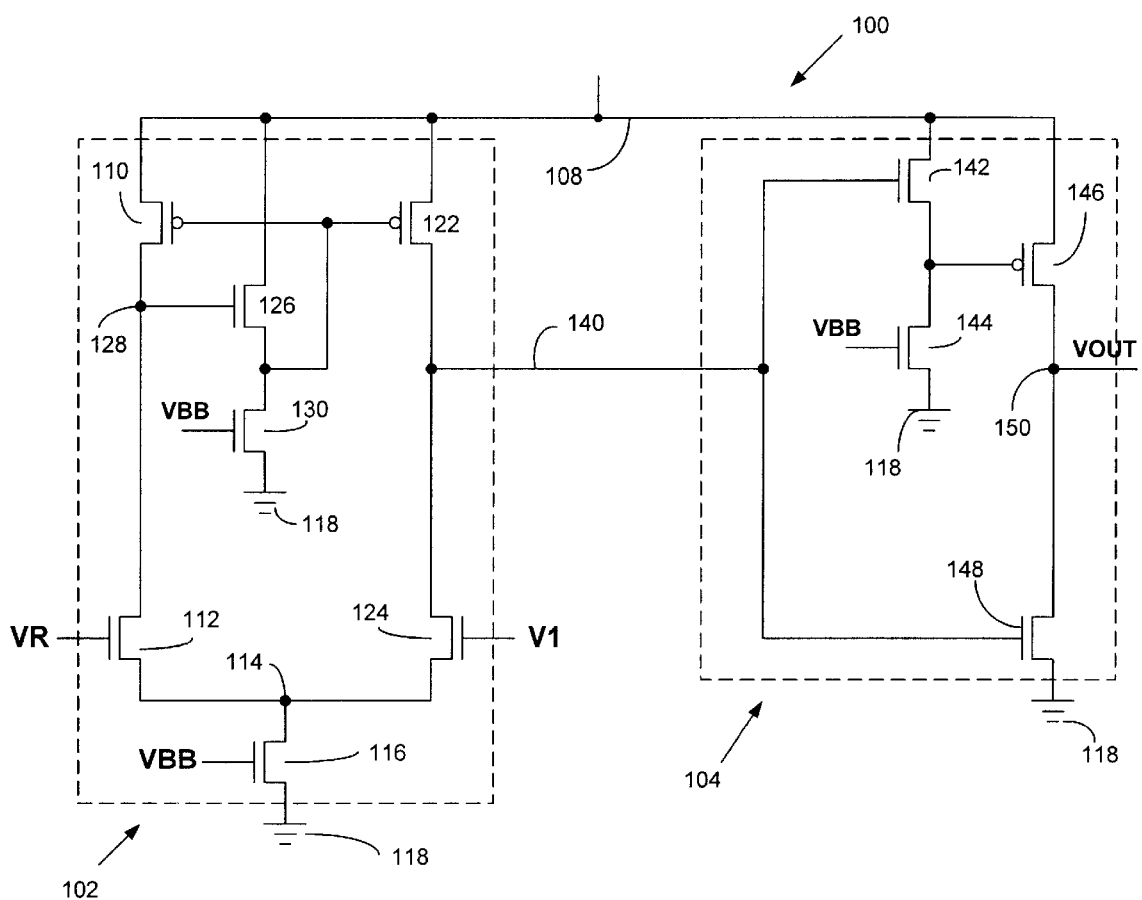
FIG. 3 is a schematic diagram of one illustrative single-ended output low voltage CMOS comparator utilizing aspects of the present invention.

FIG. 3 is a schematic diagram of one illustrative single-ended output low voltage CMOS comparator 100 utilizing aspects of the present invention. The comparator 100 comprises a differential amplifier 102 and an output inverter amplifier 104. The comparator 100 utilizes a source follower in both the differential amplifier 102 and in the output inverter amplifier 104. In an alternative embodiment, the comparator 100 may utilize a source follower in the differential amplifier 102 but not in the output inverter amplifier 104, using instead a standard CMOS inverter amplifier (not shown) as the output driver, as the output driver itself will operate correctly at certain low power supply potentials. In particular, a standard CMOS inverter amplifier, if coupled with the differential amplifier 102 of FIG. 3, will work satisfactorily as the output driver at a power supply potential of 0.9 volts DC.

The differential amplifier 102 shown in FIG. 3 includes a PMOS transistor 110 coupled in series with an NMOS transistor 112 between a first power supply potential 108 and a node 114 in the differential amplifier 102. An NMOS transistor 116 is coupled between the node 114 and a second power supply potential 118. In the embodiment illustrated in FIG. 3, the first power supply potential 108 is a positive power supply potential of 0.9 volts DC, and the second power supply potential 118 is a power supply ground potential. The differential amplifier 102 further comprises a PMOS transistor 122 coupled in series with an NMOS transistor 124 between the first power supply potential 108 and the node 114. A gate of the transistor 116 is coupled to a VBB potential of approximately 0.3 volts, and the transistor 116, when activated, serves to couple the node 114 to the second power supply potential 118, in this case, a power supply ground potential. The differential amplifier 102 further comprises two NMOS transistors 126, 130 coupled in series between the first power supply potential 108 and the second power supply potential 118. A gate of the transistor 126 is coupled to a node 128 between the transistors 110 and 112. A gate of the transistor 130 is coupled to the VBB potential of approximately 0.3 volts DC. The transistors 126, 130 function as a source follower that drives the gates of the PMOS transistors 110, 122. The gate of the transistor 112 is adapted to receive a reference voltage VR, and the gate of the transistor 124 is adapted to receive an input voltage V1. The input voltage V1 is to be compared in the comparator 100 to the reference voltage VR.

The output signal of the differential amplifier 102 at a line 140 is coupled to the output inverter amplifier 104. The output inverter amplifier 104 includes two NMOS transistors 142, 144 coupled in series between the first power supply potential 108 and the second power supply potential 118. The transistors 142, 144 function as a source follower that drives a gate of a PMOS transistor 146. A gate of the transistor 144 is coupled to the VBB potential of approximately 0.3 volts DC. The PMOS transistor 146 is coupled in series with an NMOS transistor 148 between the first power supply potential 108 and the second power supply potential 118. The output signal of the differential amplifier 102 at the line 140 is coupled to the gates of the NMOS transistors 142, 148. The node 150 provides an output signal from the output inverter amplifier 104.

Although the power supply potential 108 is only 0.9 volts DC, the turn-on and turn-off times for the comparator 100 are each approximately 4 nanoseconds. This operation is much improved as compared to the conventional CMOS comparator at a power supply potential of 0.9 volts, as indicated above.

Figure 4:
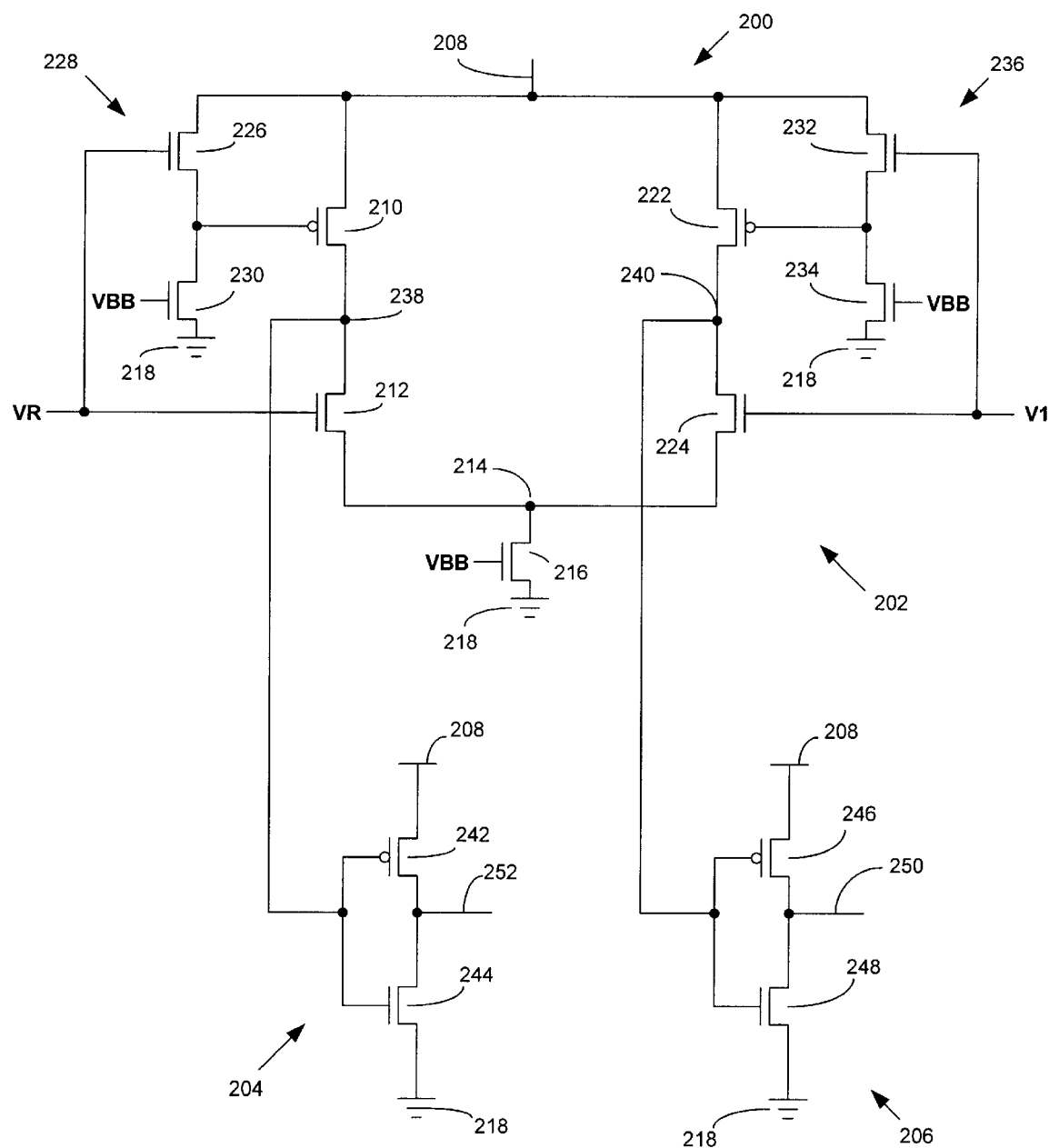
FIG. 4 is a schematic diagram of one illustrative double-ended output low voltage CMOS comparator utilizing aspects of the present invention.

FIG. 4 is a schematic diagram of one illustrative double-ended output, low voltage CMOS comparator 200 utilizing aspects of the present invention. The comparator 200 includes a differential amplifier 202 and two inverter amplifiers 204, 206. The differential amplifier 202 employs two source followers 228, 236, but the inverter amplifiers 204, 206 do not utilize source followers. The differential amplifier 202 comprises a PMOS transistor 210 coupled in series with an NMOS transistor 212 between a first power supply potential 208 and a node 214. An NMOS transistor 216 is coupled between the node 214 and a second power supply potential 218. In the embodiment illustrated in FIG. 4, the first power supply potential 208 is a positive 0.9 volts, while the second power supply potential 218 is a power supply ground potential. A gate of the transistor 216 is driven by the VBB potential of approximately 0.3 volts DC. The differential amplifier 202 further comprises a PMOS transistor 222 coupled in series with an NMOS transistor 224 between the first power supply potential 208 and the node 214.

The first source follower 228 includes an NMOS transistor 226 and an NMOS transistor 230 coupled in series between the first power supply potential 208 and the second power supply potential 218. A gate of the transistor 230 is driven by the VBB potential of approximately 0.3 volts DC. Thus, the transistor 230 functions as a current source. The first source follower circuit 228 drives a gate of the PMOS transistor 210 in the differential amplifier 202. A reference voltage VR is applied to gates of the transistors 226, 212. The second source follower circuit 236 comprises two NMOS transistors 232, 234 coupled in series between the first power supply potential 208 and the second power supply potential 218. A gate of the transistor 234 is driven by the VBB potential of approximately 0.3 volts DC. Thus, the transistor 234 acts as a current source. The second source follower circuit 236 drives a gate of the PMOS transistor 222 in the differential amplifier 202. An input voltage V1, which will be compared with the reference voltage VR, is applied to gates of the transistors 232, 224.

The differential amplifier 202 provides a double-ended output signal at nodes 238, 240. The output signal at the node 238 is coupled to the inverter amplifier 204, while the output signal at the node 240 is coupled to the inverter amplifier 206. The inverter amplifier 204 comprises a PMOS transistor 242 and an NMOS transistor 244 coupled between the first power supply potential 208 and the second power supply potential 218. An output signal of the inverter amplifier 204 is provided at a line 252. The second inverter amplifier 206 comprises a PMOS transistor 246 and an NMOS transistor 248 coupled in series between the first power supply potential 208 and the second power supply potential 218. An output signal of the inverter amplifier 206 is provided at a line 250. Using a power supply potential of 0.9 volts, the turn-on and turn-off times for the comparator 200 of FIG. 4 are very fast, on the order of approximately 2 nanoseconds or less, again providing substantial improvement over prior art comparators.

In other applications of the present invention, a differential amplifier, such as the differential amplifier 202 in FIG. 4, that utilizes two source followers, such as the source followers 228, 236 in FIG. 4, may be used without the inverter amplifiers 204, 206 coupled to their output terminals. In at least certain of those applications, the differential amplifier may serve to advantage as a building block for more complicated comparators utilizing offset compensation.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An integrated circuit comparator, comprising:
   a differential amplifier;
   a source follower circuit coupled to a gate terminal of a first transistor in the differential amplifier; and
   an output circuit coupled to the differential amplifier,
   the source follower circuit and the differential amplifier coupled to receive a first input signal.

2. The integrated circuit comparator of claim 1, wherein the source follower circuit comprises a first source follower circuit, the integrated circuit comparator further comprising:
   a second source follower circuit coupled to a gate terminal of a second transistor in the differential amplifier.

3. The integrated circuit comparator of claim 2, wherein the output circuit comprises an output inverter circuit.

4. The integrated circuit comparator of claim 2, further comprising a third source follower circuit coupled to a gate terminal of a first transistor in the output circuit.

5. The integrated circuit comparator of claim 4, wherein the output circuit comprises an output inverter circuit.

6. The integrated circuit comparator of claim 1, wherein the output circuit comprises a first output circuit, and wherein the differential amplifier comprises first and second output nodes, the integrated circuit comparator further comprising:

a second output circuit, wherein the first output circuit is coupled to the first output node of the differential amplifier, and the second output circuit is coupled to the second output node of the differential amplifier.

7. The integrated circuit comparator of claim 6, wherein the source follower circuit comprises a first source follower circuit, the integrated circuit comparator further comprising:

a second source follower circuit coupled to a gate terminal of a second transistor in the differential amplifier.

8. The integrated circuit comparator of claim 7, wherein the first and second output circuits comprise first and second output inverter circuits.

9. The integrated circuit comparator of claim 7, further comprising a third source follower circuit coupled to a gate terminal of a first transistor in the first output circuit.

10. The integrated circuit comparator of claim 9, wherein the third source follower circuit is coupled to a gate terminal of a first transistor in the second output circuit.

11. The integrated circuit comparator of claim 9, further comprising a fourth source follower circuit coupled to a gate terminal of a first transistor in the second output circuit.

12. An integrated circuit comparator, comprising:

a differential amplifier;

a first power supply line coupled to the differential amplifier, the first power supply line adapted to receive a positive power supply potential of approximately 0.9 volts;

a source follower circuit coupled to a gate terminal of a first transistor in the differential amplifier; and an output circuit coupled to the differential amplifier, the source follower circuit and the differential amplifier coupled to receive a first input signal.

13. The integrated circuit comparator of claim 12, wherein the source follower circuit comprises a first source follower circuit, the integrated circuit comparator further comprising:

a second source follower circuit coupled to a gate terminal of a second transistor in the differential amplifier.

14. The integrated circuit comparator of claim 13, wherein the output circuit comprises an output inverter circuit.

15. The integrated circuit comparator of claim 13, further comprising a third source follower circuit coupled to a gate terminal of a first transistor in the output circuit.

16. The integrated circuit comparator of claim 15, wherein the output circuit comprises an output inverter circuit.

17. The integrated circuit comparator of claim 12, wherein the output circuit comprises a first output circuit, and wherein the differential amplifier comprises first and second output nodes, the integrated circuit comparator further comprising:

a second output circuit, wherein the first output circuit is coupled to the first output node of the differential amplifier, and the second output circuit is coupled to the second output node of the differential amplifier.

18. The integrated circuit comparator of claim 17, wherein the source follower circuit comprises a first source follower circuit, the integrated circuit comparator further comprising:

a second source follower circuit coupled to a gate terminal of a second transistor in the differential amplifier.

19. The integrated circuit comparator of claim 18, wherein the first and second output circuits comprise first and second output inverter circuits.

20. The integrated circuit comparator of claim 18, further comprising a third source follower circuit coupled to a gate terminal of a first transistor in the first output circuit.

21. The integrated circuit comparator of claim 20, wherein the third source follower circuit is coupled to a gate terminal of a first transistor in the second output circuit.

22. The integrated circuit comparator of claim 20, further comprising a fourth source follower circuit coupled to a gate terminal of a first transistor in the second output circuit.

23. A differential amplifier, comprising:

first and second transistors coupled in electrical series between a first node and a second node;

third and fourth transistors coupled in electrical series between the first node and the second node; and a source follower circuit coupled to a gate terminal of the first transistor, the second transistor and the source follower adapted to receive a first input signal, and the fourth transistor adapted to receive a second input signal.

24. The differential amplifier of claim 23, wherein the source follower circuit comprises a first source follower circuit, the differential amplifier further comprising:

a second source follower circuit coupled to a gate terminal of the third transistor.

25. The differential amplifier of claim 23, wherein the first node is coupled to a first power supply node, the differential amplifier further comprising:

a fifth transistor coupled between the second node and a second power supply node.

26. A differential amplifier, comprising:

first and second transistors coupled in electrical series between a first node and a second node;

third and fourth transistors coupled in electrical series between the first node and the second node;

a source follower circuit coupled to a gate terminal of the first transistor, the second transistor adapted to receive a first input signal, and the fourth transistor adapted to receive a second input signal;

wherein the source follower circuit comprises:

a first transistor coupled to receive the first input signal; and a second transistor coupled to a power supply node.

* * * * *